United States Patent
Shichi et al.

(10) Patent No.: US 7,301,142 B2
(45) Date of Patent: Nov. 27, 2007

(54) OPTICAL ENCODER PHOTODETECTOR ARRAY WITH MULTIPLE RESOLUTIONS

(75) Inventors: Koichi Shichi, Yamatotakada (JP); Isamu Ohkubo, Kashiba (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 11/499,696

(22) Filed: Aug. 7, 2006

(65) Prior Publication Data
US 2006/0266931 A1 Nov. 30, 2006

Related U.S. Application Data

(63) Continuation of application No. 10/874,545, filed on Jun. 24, 2004, now abandoned.

(30) Foreign Application Priority Data

Jun. 26, 2003 (JP) .......................... P2003-182403

(51) Int. Cl.
*G01D 5/34* (2006.01)
(52) U.S. Cl. .......................... 250/231.16; 250/231.13; 250/231.14; 356/616; 356/617
(58) Field of Classification Search ............................... 250/231.13–231.18, 208.2, 214 R, 214 SW; 356/616–617; 33/1 PT, 1 N, 1 L; 341/11, 341/13
See application file for complete search history.

(56) References Cited

U.S. PATENT DOCUMENTS

| | | | |
|---|---|---|---|
| 4,691,101 A | | 9/1987 | Leonard |
| 5,771,068 A | * | 6/1998 | Sali et al. ...................... 348/92 |
| 5,981,942 A | | 11/1999 | Ieki et al. |
| 6,175,109 B1 | | 1/2001 | Setbacken et al. |
| 6,452,159 B2 | | 9/2002 | Holzapfel et al. |
| 6,590,201 B2 | | 7/2003 | Ueda et al. |
| 6,635,863 B1 | * | 10/2003 | Nihommori et al. ... 250/231.13 |
| 6,665,065 B1 | * | 12/2003 | Phan et al. ............... 356/237.1 |
| 6,713,456 B1 | * | 3/2004 | Usman et al. ................. 514/44 |
| 6,713,756 B2 | | 3/2004 | Yamamoto et al. |
| 6,727,493 B2 | * | 4/2004 | Franklin et al. ........ 250/231.13 |
| 6,794,637 B1 | * | 9/2004 | Holzapfel et al. ..... 250/231.13 |
| 6,838,688 B2 | | 1/2005 | Aoki et al. |
| 6,867,424 B2 | * | 3/2005 | Kurosawa et al. ........ 250/559.4 |
| 2002/0015194 A1 | | 2/2002 | Watanabe |
| 2003/0047673 A1 | | 3/2003 | Thorburn et al. |

(Continued)

FOREIGN PATENT DOCUMENTS

EP 710819 A1 * 5/1996

(Continued)

*Primary Examiner*—Davienne Monbleau
(74) *Attorney, Agent, or Firm*—Birch, Stewart, Kolasch & Birch, LLP

(57) ABSTRACT

A photodetector for an optical encoder has plural sets of segmented photodiodes, each set of which is made by two adjoining segmented photodiodes capable of coping with a scale slit having a reference resolution. Output lines of the two adjoining segmented photodiodes are connected together in each set of the photodiodes. These output lines are connected to output lines of the corresponding segmented photodiodes in the other sets. The two adjoining segmented photodiodes function like one segmented photodiode, and thereby, the resolution of the applied scale slit is made ½ of the reference resolution. Thus, this photodetector easily copes with a scale slit having a half resolution of the reference resolution at low cost only by modification of wiring without changing any configuration of the segmented photodiodes.

3 Claims, 12 Drawing Sheets

U.S. PATENT DOCUMENTS

| | | | |
|---|---|---|---|
| 2003/0094586 A1* | 5/2003 | Kurosawa et al. | 250/559.4 |
| 2003/0215129 A1* | 11/2003 | Yang et al. | 382/149 |
| 2005/0035311 A1* | 2/2005 | Asakawa et al. | 250/559.16 |

FOREIGN PATENT DOCUMENTS

| | | |
|---|---|---|
| JP | 59-40258 | 3/1984 |
| JP | 69-292016 | 12/1986 |
| JP | 8-3427 | 1/1996 |
| JP | 10051308 | 2/1998 |
| JP | 11040563 | 2/1999 |
| JP | 2001-183176 | 7/2001 |

* cited by examiner

Fig. 1A
ARRANGEMENT AND
WIRING OF SEGMENTED
PHOTODIODES
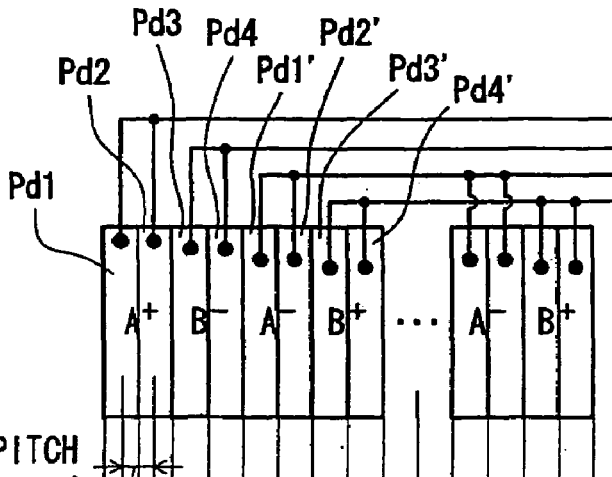
Fig. 1B
SLIT PITCH
Fig. 1C
SEGMENTED PHOTODIODE
OUTPUTS DURING SLIT
MOVEMENT
Fig. 1D
DIGITALIZED
OUTPUTS
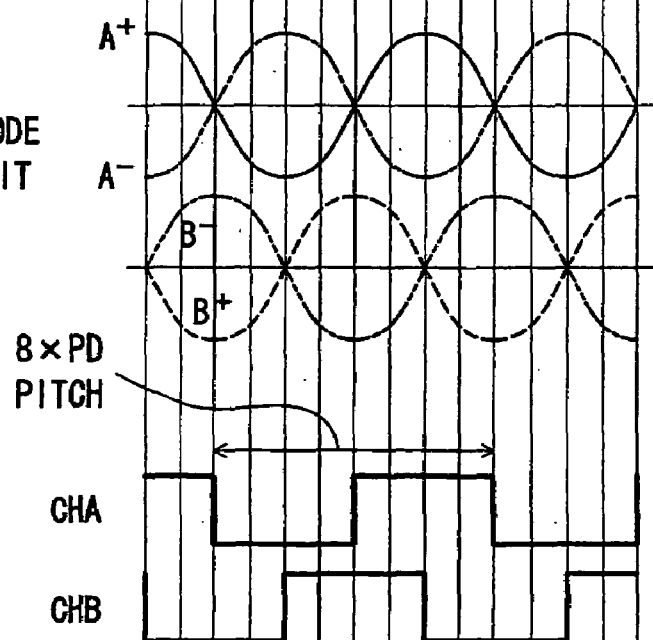

Fig. 2A
ARRANGEMENT AND
WIRING OF SEGMENTED
PHOTODIODES
Fig. 2B
SLIT PITCH
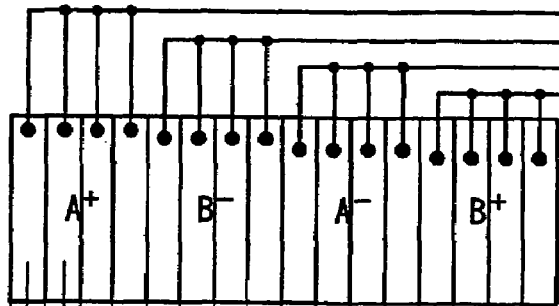
Fig. 2C
SEGMENTED PHOTODIODE
OUTPUTS DURING SLIT
MOVEMENT
Fig. 2D
DIGITALIZED
OUTPUTS
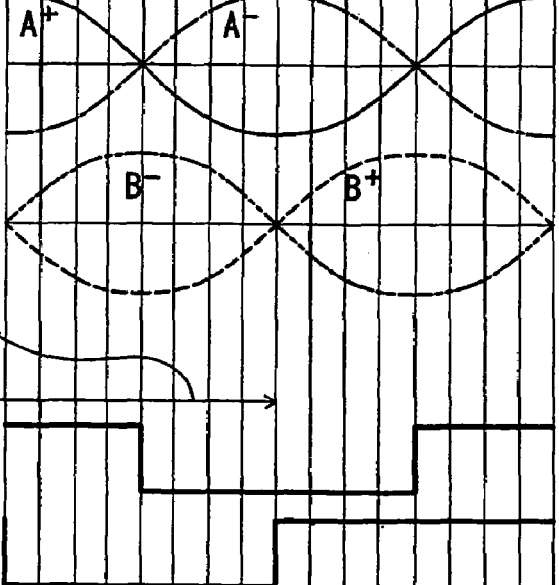

*Fig. 3A*
ARRANGEMENT AND
WIRING OF SEGMENTED
PHOTODIODES
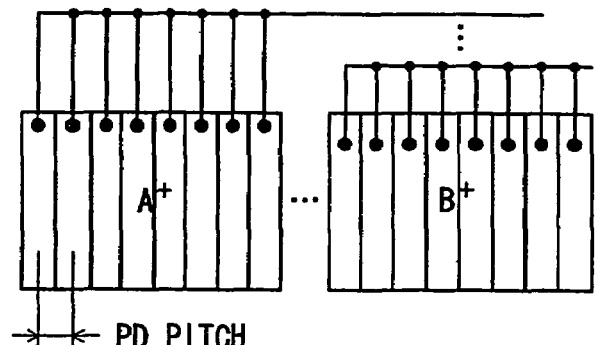
*Fig. 3B*
SLIT PITCH
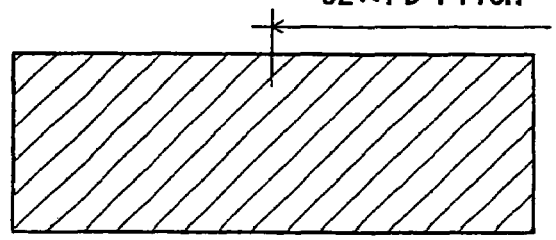
*Fig. 3C*
SEGMENTED PHOTODIODE
OUTPUTS DURING SLIT
MOVEMENT
*Fig. 3D*
DIGITALIZED
OUTPUTS
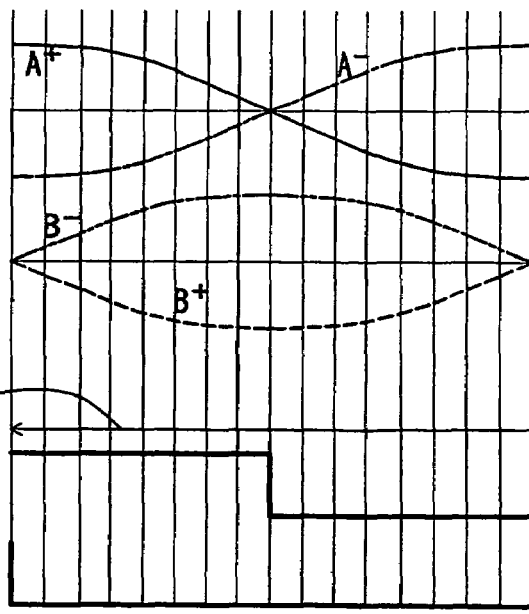

*Fig. 4A*
ARRANGEMENT AND
WIRING OF SEGMENTED
PHOTODIODES
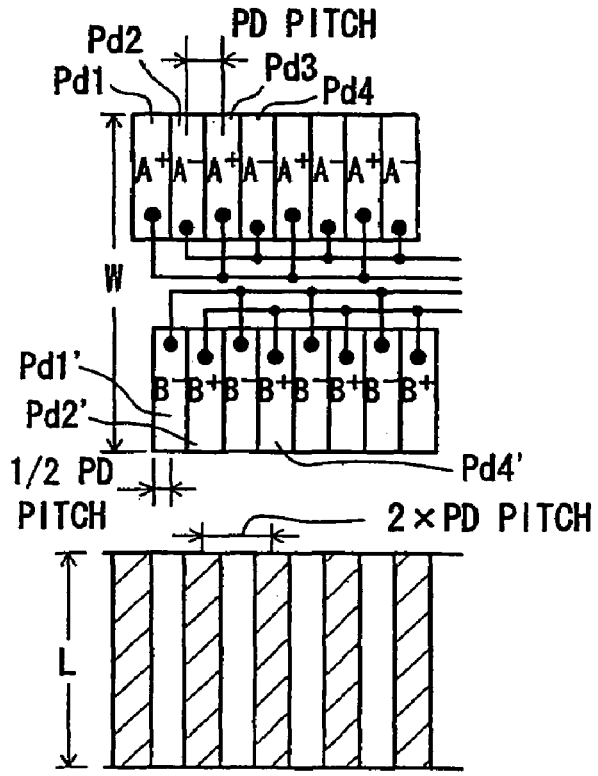
*Fig. 4B*
SLIT PITCH
*Fig. 4C*
SEGMENTED PHOTODIODE
OUTPUTS DURING SLIT
MOVEMENT
*Fig. 4D*
DIGITALIZED
OUTPUTS
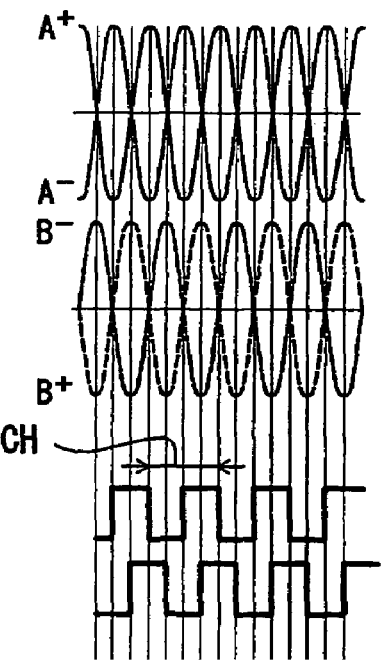

Fig. 5A
ARRANGEMENT AND
WIRING OF SEGMENTED
PHOTODIODES
Fig. 5B
SLIT PITCH
Fig. 5C
SEGMENTED PHOTODIODE
OUTPUTS DURING SLIT
MOVEMENT
Fig. 5D
DIGITALIZED
OUTPUTS
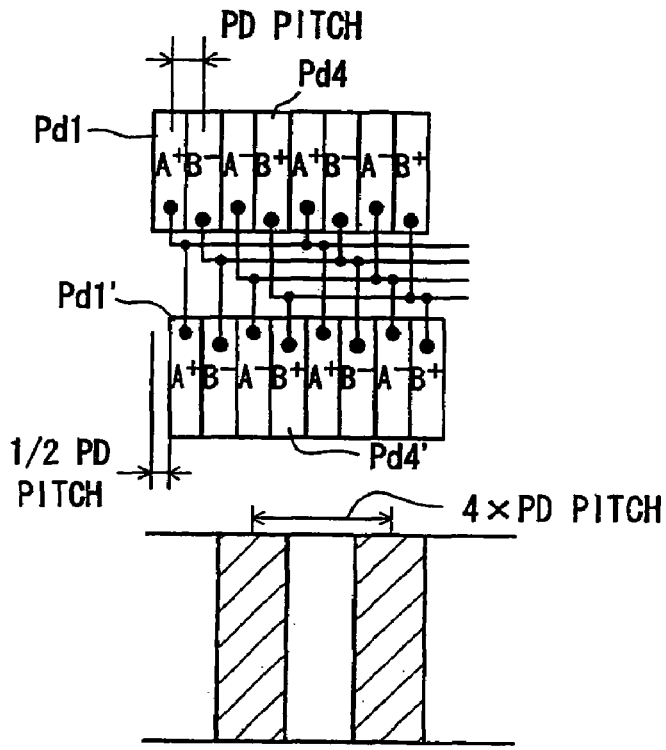
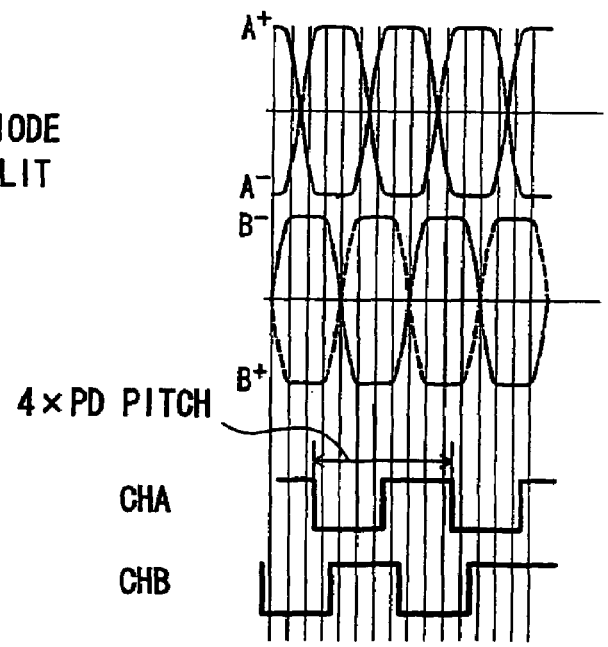

Fig. 6A
ARRANGEMENT AND WIRING OF SEGMENTED PHOTODIODES
Fig. 6B
SLIT PITCH
Fig. 6C
SEGMENTED PHOTODIODE OUTPUTS DURING SLIT MOVEMENT
Fig. 6D
DIGITALIZED OUTPUTS
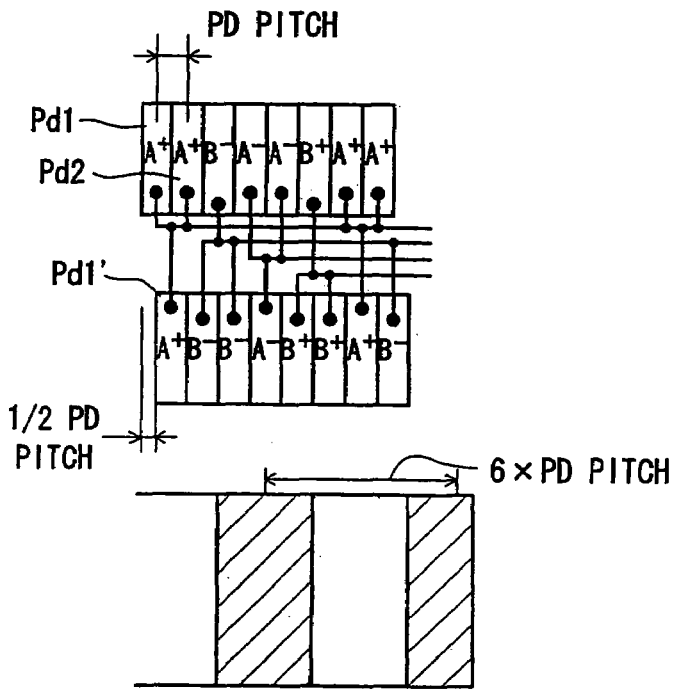
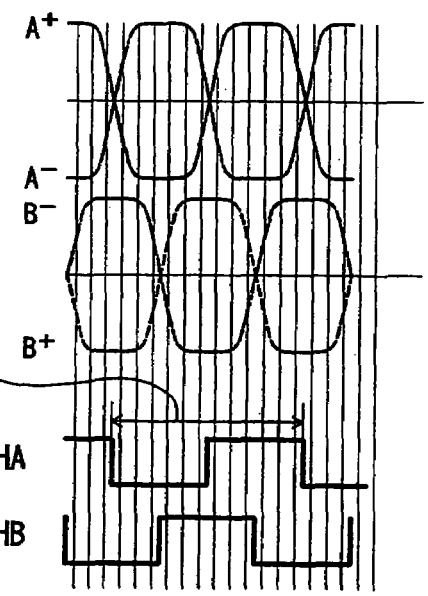

*Fig. 7A*
ARRANGEMENT AND
WIRING OF SEGMENTED
PHOTODIODES
*Fig. 7B*
SLIT PITCH
*Fig. 7C*
SEGMENTED PHOTODIODE
OUTPUTS DURING SLIT
MOVEMENT
*Fig. 7D*
DIGITALIZED
OUTPUTS
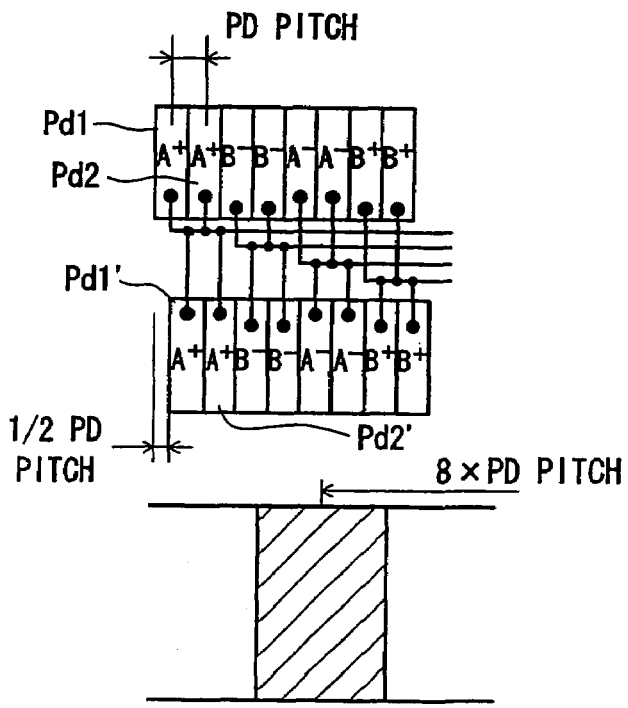
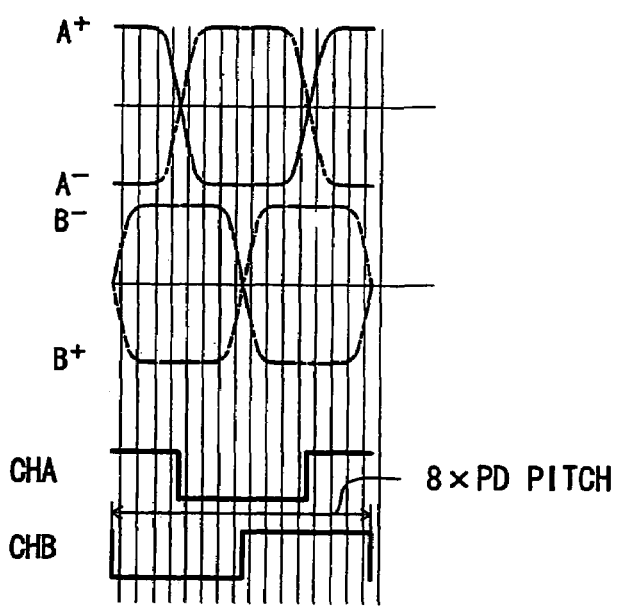

*Fig. 8A*
ARRANGEMENT AND
WIRING OF SEGMENTED
PHOTODIODES
*Fig. 8B*
SLIT PITCH
*Fig. 8C*
SEGMENTED PHOTODIODE
OUTPUTS DURING SLIT
MOVEMENT
*Fig. 8D*
DIGITALIZED
OUTPUTS
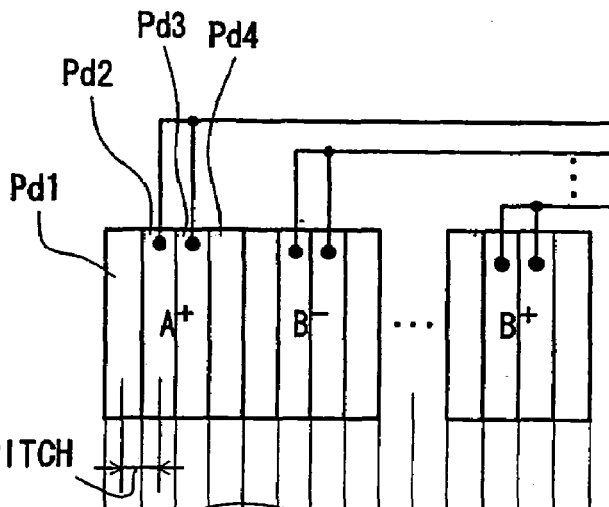
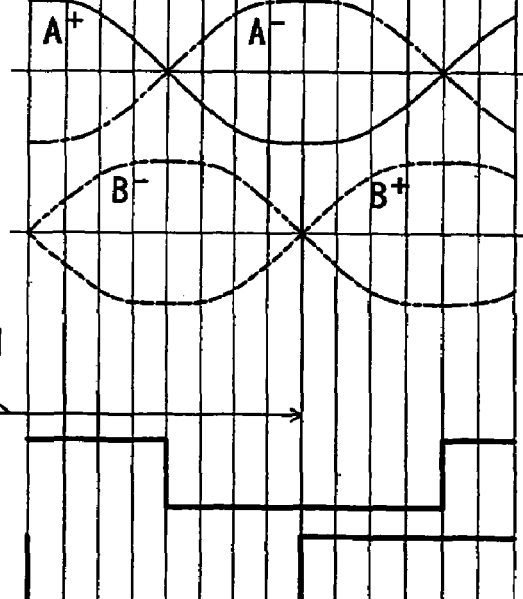

*Fig. 9A*
ARRANGEMENT AND WIRING OF SEGMENTED PHOTODIODES
*Fig. 9B*
SLIT PITCH
*Fig. 9C*
SEGMENTED PHOTODIODE OUTPUTS DURING SLIT MOVEMENT
*Fig. 9D*
DIGITALIZED OUTPUTS
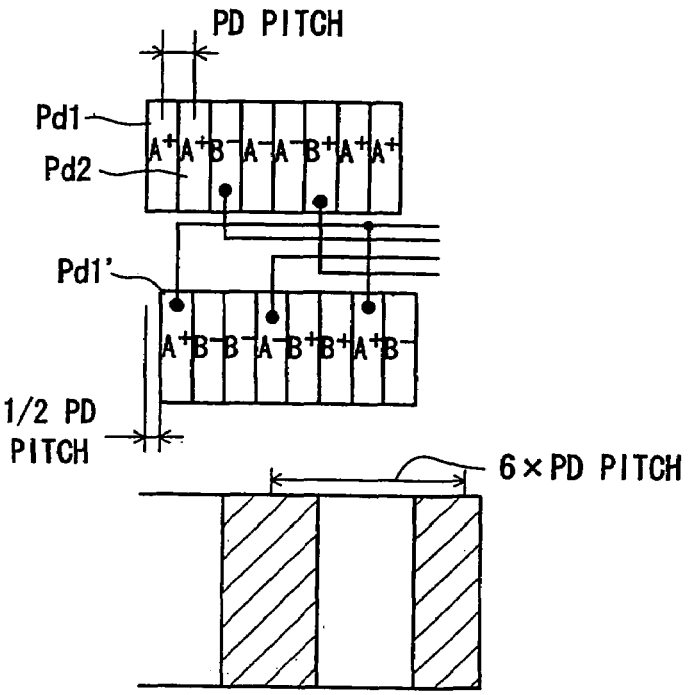
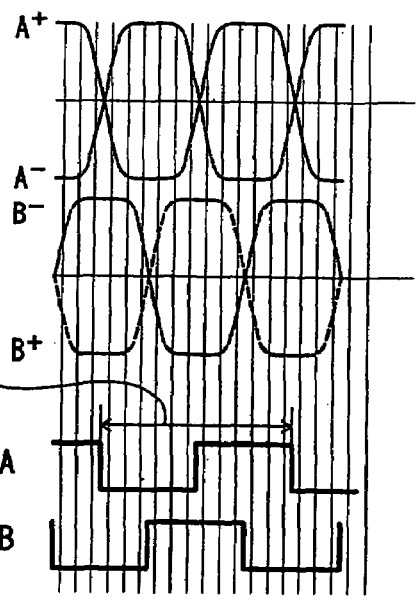

ARRANGEMENT AND WIRING OF SEGMENTED PHOTODIODES

SLIT PITCH

SEGMENTED PHOTODIODE OUTPUTS DURING SLIT MOVEMENT

DIGITALIZED OUTPUTS

Fig. 12A PRIOR ART
ARRANGEMENT AND WIRING OF SEGMENTED PHOTODIODES
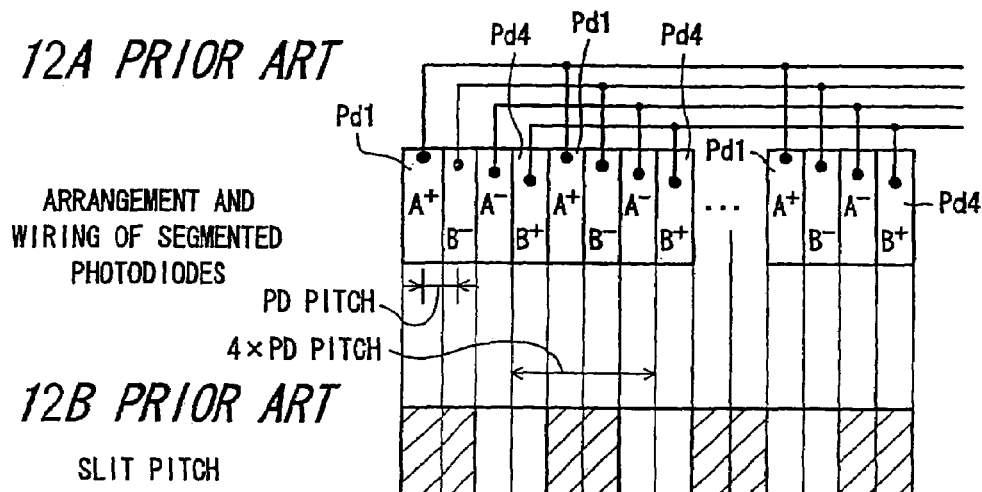
Fig. 12B PRIOR ART
SLIT PITCH
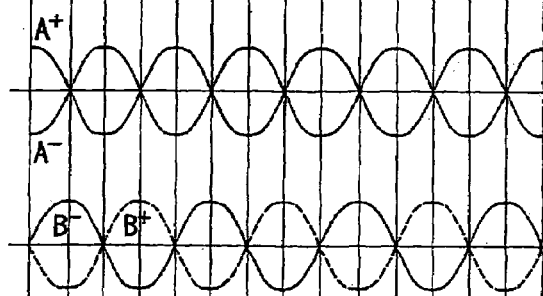
Fig. 12C PRIOR ART
SEGMENTED PHOTODIODE OUTPUTS DURING SLIT MOVEMENT
Fig. 12D PRIOR ART
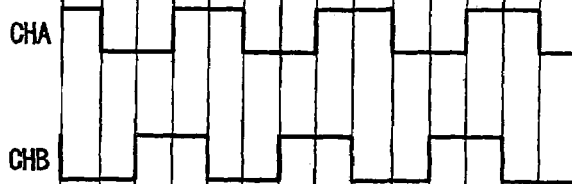
DIGITALIZED OUTPUTS

OPTICAL ENCODER PHOTODETECTOR ARRAY WITH MULTIPLE RESOLUTIONS

CROSS-REFERENCE TO RELATED APPLICATIONS

This application is a Continuation of co-pending application Ser. No. 10/874,545 filed on Jun. 24, 2004, now abandoned, and for which priority is claimed under 35 U.S.C. § 120. application Ser. No. 10/874,545 claims priority under 35 U.S.C. § 119 based on Japanese Application No. 2003-182403, filed Jun. 26, 2003. The entire contents of each of these applications are hereby incorporated by reference.

BACKGROUND OF THE INVENTION

The present invention relates to an electrically multidivided photodetector used for an optical encoder.

Optical encoders have been used in a wide variety of fields for controlling the rotational speed, rotational direction, rotational position and so on of a motor or the like and controlling the travel speed, movement direction, movement position and so on of a moving object. For example, reference should be made to JP 59-40258 A and JP 61-292016 A.

A disk called a code disk is used for the rotational control. A thin plate called a scale slit is used for the movement control. The code disk is provided with optically transparent slits arranged at prescribed intervals along its circumference, where optically transparent areas and opaque areas exist alternately along the circumference of the code disk. On the other hand, the scale slit is provided with optically transparent slits arranged at prescribed intervals along its one side, where optically transparent areas and opaque areas exist alternately along the above-mentioned side of the scale slit.

For the rotational control, the rotational amount and the rotational speed are detected by counting the number of slits of the rotating code disk by means of a photodetector. For the movement control, likewise, the movement amount and the travel speed are detected by counting the number of slits of the moving scale slit by means of a photodetector. Further, the rotational direction or the movement direction can also be detected by using the two kinds of signals having a phase difference of 90 degree, the signals being formed by the positions of a plurality of photodiodes constituting the photodetector.

In the code disk and the scale slit, the opaque areas is formed by an opaque material such as ink on a board made of a transparent resin or glass, so that a stripe pattern is formed by the opaque areas and the transparent slits between the opaque areas. Otherwise, in some cases, the transparent slit is formed by providing holes through a metal plate.

Regarding the configuration of the photodiodes, as shown in FIGS. 11A and 12A and described in the above-stated patent documents, one set of photodiodes is constructed by four adjoining segmented photodiodes Pd1 to Pd4 which are formed on one semiconductor chip under a electrically separated state. The slit pitch of the scale slit is made 4-fold of the arrangement pitch of the segmented photodiodes. Then, one set of the segmented photodiodes is arranged as shown in FIG. 11A. In some cases, as shown in FIG. 12A plural sets of the segmented photodiodes are arranged in order to level positional variations in the quantity of light from a light source. Then, outputs of the segmented photodiodes Pd1 to Pd4 are respectively connected to outputs of the other corresponding segmented photodiodes as shown in FIG. 12A (refer to FIG. 6B of JP 61-292016 A).

Among the photocurrents outputted from the segmented photodiodes Pd1 to Pd4 when the scale slit moves, a pair of photocurrents A+(Pd1) and A−(Pd3) and a pair of photocurrents B+(Pd2) and B−(Pd4), which have a phase difference of 180° each other as shown in FIGS. 11C and 12C, are inputted to a comparator (not shown) so that the levels of the input signals are compared with each other. Consequently, two digital rectangular waves having a phase difference of 90° are obtained, as indicated by CHA (a channel A) and CHB (a channel B) in FIGS. 11D and 12D.

In the above case, the design value of the resolution of the photodiodes is determined by the arrangement pitch of the segmented photodiodes Pd1 to Pd4. Moreover, the slit pitch (resolution) of the scale slit used for forming two digital rectangular waves, which have a phase difference of 90°, is also limited within a narrow range centered around a theoretical value based on the arrangement pitch of the segmented photodiodes Pd1 to Pd4.

However, the above-stated conventional optical encoder has a disadvantage as follows. That is, the slit pitch of the code disk and the scale slit is made 4-fold of the arrangement pitch of the segmented photodiodes Pd1 to Pd4. Therefore, in the case of a photodetector for the above-stated conventional optical encoder constructed by the segmented photodiodes obtained by electrically quadrisecting one semiconductor chip, it is required to prepare a semiconductor chip such that the value being 4-fold of the arrangement pitch of the segmented photodiodes coincides with the slit pitch (resolution) of the desired code disk or scale slit.

Moreover, the segmented photodiodes Pd1 to Pd4, which constitute the photodetector, are arranged in a line in the above case, and therefore, the slit pitch (resolution) of the code disk or the scale slit eventually obtained becomes theoretically four pitches of the segmented photodiodes.

For the above reasons, the above-stated conventional optical encoder has the disadvantage that the photodetector must be remade according to the slit pitch (resolution) of the code disk or the scale slit every time the required slit pitch (resolution) of the code disk or the scale slit is changed.

SUMMARY OF THE INVENTION

An aspect of the present invention is to provide a photodetector for an optical encoder capable of coping also with various slit pitches (resolutions) of a code disk or a scale slit.

In order to achieve the above-stated aspect, the present invention provides a photodetector for an optical encoder constructed by a plurality of segmented photodiodes which are formed by being electrically divided on a semiconductor chip, wherein output terminals of two or more adjacent segmented photodiodes are electrically connected together.

According to the above construction, in the case that the photodetector is regarded as a reference photodetector, and the resolution of the code disk or the scale slit applied to this reference photodetector is regarded as a reference resolution, m (m: integer of not smaller than 2) segmented photodiodes, the output terminals of which are electrically connected together, function as one segmented photodiode of the reference photodetector. Consequently, the resolution of the applied code disk or scale slit becomes 1/m of the reference resolution.

The present invention also provides a photodetector for an optical encoder constructed by a plurality of segmented photodiodes which are formed by being electrically divided on a semiconductor chip, wherein two or more arrays of the plurality of segmented photodiodes are arranged in parallel such that segmented photodiodes in one array are shifted in relation to segmented photodiodes in another array by one half an arrangement pitch of the segmented photodiodes to mutually shift phases of segmented photodiodes between the arrays.

According to the above-mentioned construction, in the case that this photodetector is regarded as a reference photodetector, and the resolution of the code disk or the scale slit applied to the reference photodetector is regarded as a reference resolution, the segmented photodiode of a half width functions as one segmented photodiode of the reference photodetector. Consequently, the resolution of the applied code disk or scale slit becomes 2-fold of the reference resolution.

In one embodiment of the present invention, output terminals of two or more adjacent segmented photodiodes in each of the arrays are electrically connected together.

According to this embodiment, m segmented photodiodes, the output terminals of which are electrically connected together, function as one segmented photodiode in the reference photodetector. Consequently, the resolution of the applied code disk or scale slit becomes 2/m of the reference resolution.

In one embodiment of the present invention, output terminals of two segmented photodiodes located at both ends in three or more adjacent segmented photodiodes are electrically disconnected.

According to this embodiment, a wide constant gap is provided between segmented photodiodes, the output terminals of which are electrically connected together to generate an output signal of one phase. Therefore, influence of a leakage current is alleviated and thus a signal-to-noise ratio is improved, the leakage current becoming a noise for a signal current from the segmented photodiodes that constitute respective phases.

In one embodiment of the present invention, the electrical connection of the output terminals of the segmented photodiodes is achieved by adjusting metal wiring with use of laser trimming.

According to this embodiment, the resolution of the photodiodes in the photodetector is set by a simple process of laser trimming in response to the resolution of an applied code disk or scale slit.

In one embodiment of the present invention, the electrical connection of the output terminals of the segmented photodiodes is achieved by switching means having a control terminal, and the segmented photodiodes, the output terminals of which are electrically connected, is changed in number by an external control signal to the control terminal of the switching means.

According to this embodiment, even if the resolution of the applied code disk or scale slit is variously changed, the setting of the resolution of the photodiodes in the photodetector is changed by the external control signal in response to the resolution of the code disk or the scale slit.

BRIEF DESCRIPTION OF THE DRAWINGS

The present invention will become more fully understood from the detailed description given hereinbelow and the accompanying drawings which are given by way of illustration only, and thus are not limitative of the present invention, and wherein:

FIGS. 1A, 1B, 1C and 1D are diagrams showing arrangement and wiring of segmented photodiodes, a slit pitch, segmented photodiode outputs and digitized outputs, respectively, in a photodetector for a ½ resolution optical encoder according to the present invention;

FIGS. 2A, 2B, 2C and 2D are diagrams showing the arrangement and wiring of segmented photodiodes, the slit pitch, the segmented photodiode outputs and the digitized outputs, respectively, in a photodetector for a ¼ resolution optical encoder according to the present invention;

FIGS. 3A, 3B, 3C and 3D are diagrams showing the arrangement and wiring of segmented photodiodes, the slit pitch, the segmented photodiode outputs and the digitized outputs, respectively, in a photodetector for a ⅛ resolution optical encoder according to the present invention;

FIGS. 4A, 4B, 4C and 4D are diagrams showing the arrangement and wiring of segmented photodiodes, the slit pitch, the segmented photodiode outputs and the digitized outputs, respectively, in a photodetector for a two-fold resolution optical encoder according to the present invention;

FIGS. 5A, 5B, 5C and 5D are diagrams showing the arrangement and wiring of segmented photodiodes, the slit pitch, the segmented photodiode outputs and the digitized outputs, respectively, in a photodetector for a one-fold resolution optical encoder according to the present invention;

FIGS. 6A, 6B, 6C and 6D are diagrams showing the arrangement and wiring of segmented photodiodes, the slit pitch, the segmented photodiode outputs and the digitized outputs, respectively, in a photodetector for a ⅔-fold resolution optical encoder according to the present invention;

FIGS. 7A, 7B, 7C and 7D are diagrams showing the arrangement and wiring of segmented photodiodes, the slit pitch, the segmented photodiode outputs and the digitized outputs, respectively, in a photodetector for a ½ resolution optical encoder according to the present invention, different from FIGS. 1A through 1D;

FIGS. 8A, 8B, 8C and 8D are diagrams showing the arrangement and wiring of segmented photodiodes, the slit pitch, the segmented photodiode outputs and the digitized outputs, respectively, in a photodetector for a ¼ resolution optical encoder according to the present invention, different from FIGS. 2A through 2D;

FIGS. 9A, 9B, 9C and 9D are diagrams showing the arrangement and wiring of segmented photodiodes, the slit pitch, the segmented photodiode outputs and the digitized outputs, respectively, in a photodetector for a ⅔-fold resolution optical encoder according to the present invention, different from FIGS. 6A through 6D;

FIGS. 12A, 12B, 12C and 12D are diagrams showing the arrangement and wiring of segmented photodiodes, the slit pitch, the segmented photodiode outputs and the digitized outputs, respectively, in a conventional photodetector for an optical encoder, different from FIGS. 11A through 11D.

DETAILED DESCRIPTION OF THE PREFERRED EMBODIMENTS

The present invention will be described in detail below on the basis of embodiments with reference to the drawings.

First Embodiment

The present embodiment is related to a photodetector for an optical encoder, wherein plural sets of segmented photodiodes, each set of which is constructed by four adjoining segmented photodiodes Pd1 to Pd4, are arranged so that the photodetector is capable of coping with a plurality of resolutions of a scale slit (a thin plate with slits) by changing the number of sets of the segmented photodiodes as well as connection between the segmented photodiodes.

In the above case, the change of connection between the segmented photodiodes is achieved by preparing a plurality of kinds of masks to be used in the forming process of connection wiring and changing the mask.

FIRST EXAMPLE

FIGS. 1A to 1D are diagrams of a photodetector for an optical encoder, which is capable of coping with a scale slit having a half resolution relative to the resolution of the scale slit of FIGS. 10A and 10B. FIGS. 1A, 1B, 1C and 1D respectively show arrangement and wiring of segmented photodiodes, a slit pitch, segmented photodiode outputs and digitalized outputs.

Figure 10:
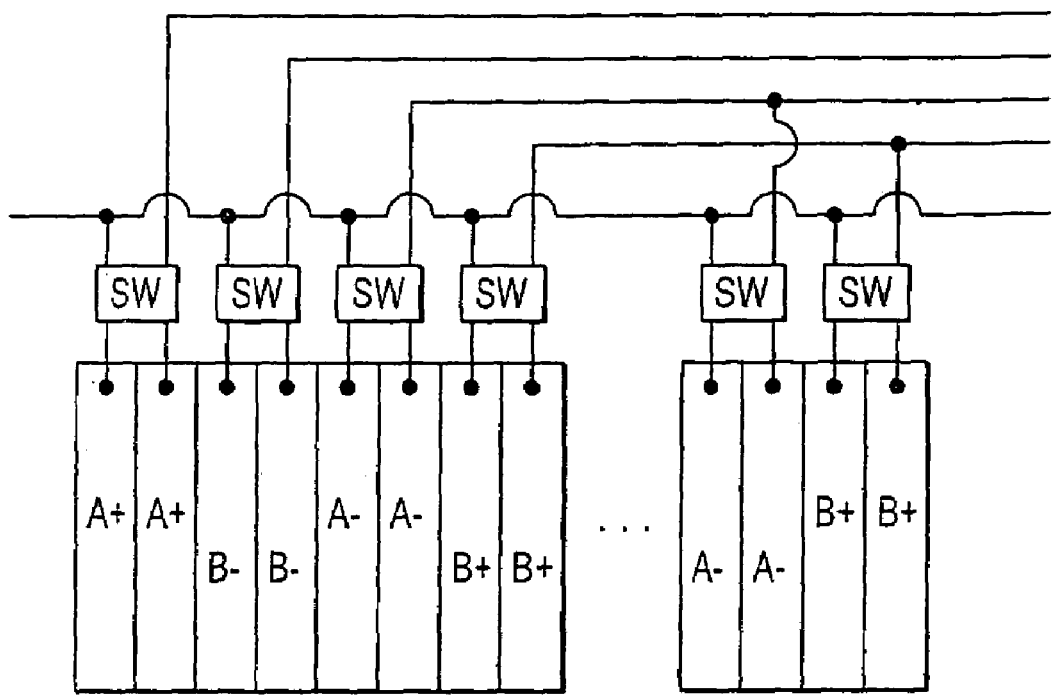
FIG. 10 is a diagram showing an arrangement including switching means for interconnecting segmented diodes.
Figures 11A, 11B, 11C, 11D:
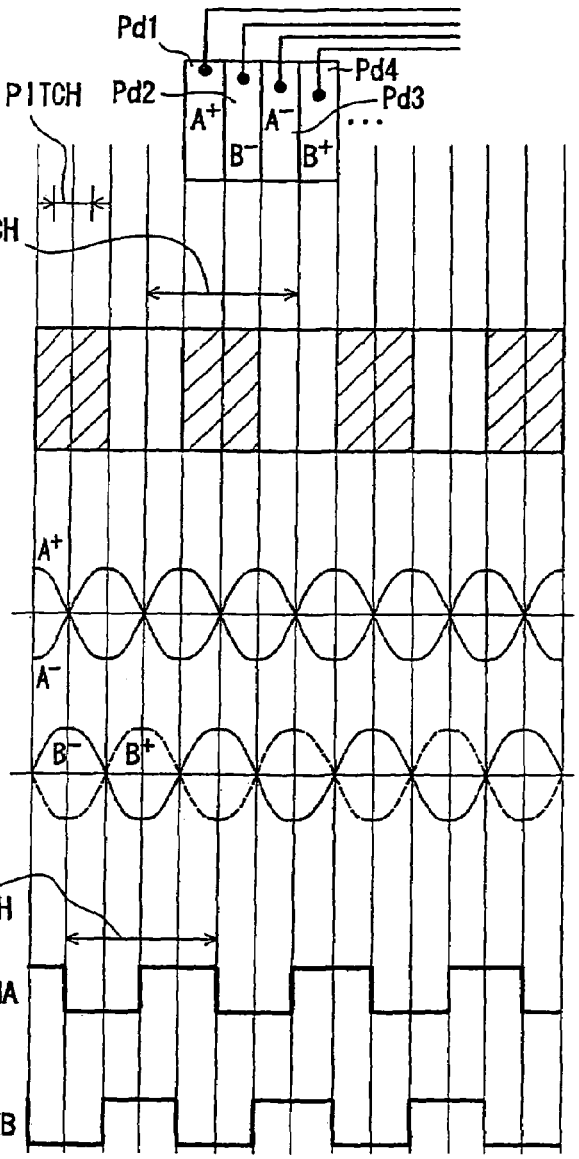
FIGS. 11A, 11B, 11C and 11D are diagrams showing the arrangement and wiring of segmented photodiodes, the slit pitch, the segmented photodiode outputs and the digitized outputs, respectively, in a conventional photodetector for an optical encoder.

In this photodetector, one set of segmented photodiodes is constructed by a subset of Pd1 to Pd4 and a subset of Pd1' to Pd4', which are equivalent to two sets of the segmented photodiodes Pd1 to Pd4 shown in FIG. 10A and functions as the segmented photodiodes Pd1 to Pd4 of FIG. 10. Further, plural sets of the segmented photodiodes Pd1 to Pd4 and Pd1' to Pd4' are arranged in order to level variations in the quantity of light from the light source, similarly to the case of FIGS. 11A to 11D.

Specifically, two output lines of two adjoining segmented photodiodes i.e. Pd1 and Pd2; Pd3 and Pd4; Pd1' and Pd2'; and Pd3' and Pd4' are connected each other. Further, these output lines of the segmented photodiodes are respectively connected to output lines of corresponding segmented photodiodes in the other similar sets of segmented photodiodes, as in the case of FIGS. 11A to 11D.

With this arrangement, two adjoining segmented photodiode Pd1 and Pd2; Pd3 and Pd4; Pd1' and Pd2'; and Pd3' and Pd4', the output lines of which are respectively connected, can be made to function as one segmented photodiode Pd1, Pd2, Pd3 and Pd4 of FIGS. 10A to 10D. As shown in FIGS. 1A and 1B, the slit pitch of the scale slit is made 8-fold of the arrangement pitch (PD pitch) of the segmented photodiodes Pd. That is, the resolution of the scale slit is made ½ of the resolution (hereinafter referred to as a reference resolution) of the conventional scale slit shown in FIGS. 10A and 10B.

Moreover, plural sets of segmented photodiodes are arranged, each set of which is constructed by three adjacent subsets of the segmented photodiodes Pd1 to Pd4 shown in FIGS. 10A to 10D. Output lines of three adjoining segmented photodiodes in each set are connected each other. Also, these output lines are respectively connected to the output lines of the corresponding segmented photodiodes among the sets of segmented photodiodes so as to have ⅓ of the reference resolution.

As described above, according to the present example, the resolution of the scale slit can be made ½ or ⅓ of the reference resolution only by changing the wiring without changing the configuration of the segmented photodiodes of FIGS. 10A to 10D. Therefore, this arrangement can cope with various resolutions of the scale slit easily at low cost.

SECOND EXAMPLE

FIGS. 2A to 2D are diagrams of a photodetector for an optical encoder, which is capable of coping with a scale slit having a ¼ resolution of the reference resolution. FIGS. 2A, 2B, 2C and 2D show arrangement and wiring of segmented photodiodes, a slit pitch, segmented photodiode outputs and digitalized outputs.

In the present example, plural sets of segmented photodiodes are arranged, each set of which is constructed by four adjacent subsets of the segmented photodiodes Pd1 to Pd4 formed electrically quadrisected on a semiconductor chip having the same size as that of the photodetector of FIGS. 10A to 10D. Then, output lines of the four adjoining segmented photodiodes in each set are connected together. The four connected output lines in each set are also connected to four connected output lines of the corresponding segmented photodiodes in the other sets of segmented photodiodes. Therefore, the four adjoining segmented photodiodes function as one segmented photodiode of FIGS. 10A to 10D. Thereby, the resolution of the scale slit can be made ¼ of the reference resolution.

Likewise, as shown in FIGS. 3A to 3D, plural sets of the segmented photodiodes are arranged, each set of which is constructed by eight adjacent subsets of the segmented photodiodes Pd1 to Pd4 of FIGS. 10A to 10D. Then, output lines of the eight adjoining segmented photodiodes in each set are connected together. The eight connected output lines in each set are also connected to eight connected output lines of corresponding segmented photodiodes in the other sets. With this arrangement, the resolution of the scale slit is made ⅛ of the reference resolution.

As described above, in the present embodiment, plural sets of the segmented photodiodes are arranged, each set of which is constructed by the number n (n: positive integer) of the adjacent photodetectors of FIGS. 10A to 10D. Therefore, the slit pitch of the scale slit can be made 4n-fold of the arrangement pitch of the segmented photodiodes by connecting together the output lines of the number n of adjacent segmented photodetectors and connecting together output lines of the corresponding segmented photodetectors among the sets thereof.

In brief, the present embodiment can cope with the scale slit of which the resolution is 1/n of the reference resolution by directly using the photodetector for an optical encoder shown in FIGS. 10A to 10D.

Second Embodiment

The present embodiment is related to a photodetector for an optical encoder where two segmented photodiode arrays are arranged in parallel, each array being constituted by arranging plural sets of segmented photodiodes, each set of which is constructed by four adjoining segmented photodiodes Pd1 to Pd4, and where phases of the arrays are mutually shifted by one half the arrangement pitch of the segmented photodiodes Pd. The photodetector for an optical encoder is capable of coping with a plurality of resolutions of a scale slit by changing the number of sets of the segmented photodiodes and changing connection between the segmented photodiodes.

In the above case, the change of connection between the segmented photodiodes is achieved by changing a plurality of kinds of masks prepared and used in the forming process of connection wiring.

THIRD EXAMPLE

FIGS. 4A to 4D show diagrams of the arrangement and wiring of segmented photodiodes (FIG. 4A), the slit pitch (FIG. 4B), the segmented photodiode outputs (FIG. 4C) and the digitalized outputs (FIG. 4D) with relation to a photodetector for an optical encoder capable of coping with a scale slit of which the resolution is 2-fold of the reference resolution.

In this photodetector for an optical encoder, a first segmented photodiode array is formed by arranging in series plural sets of the segmented photodiodes constructed by the segmented photodiodes Pd1 to Pd4 shown in FIGS. 10A to 10D so as to level variations in the quantity of light from the light source. Likewise, a second segmented photodiode array is formed by arranging in series plural sets of the segmented photodiodes constructed by the segmented photodiodes Pd1 to Pd4 of FIGS. 10A to 10D. Then, the first segmented photodiode array and the second segmented photodiode array are arranged in parallel with their phases mutually shifted by one half the arrangement pitch of the segmented photodiodes.

Then, with regard to the connection between the segmented photodiodes, the output lines of every other segmented photodiodes of the first segmented photodiode array are connected together, and the output lines of the remaining segmented photodiodes are connected together. Likewise, the output lines of every other segmented photodiodes of the second segmented photodiode array are connected together, and the output lines of the remaining segmented photodiodes are connected together. Then, the slit length L of the scale slit is made roughly equal to the total width W of the first and second segmented photodiode arrays arranged in parallel or sufficiently long so that incident light is not obstructed.

Thus, as one set of segmented photodiodes to function as the segmented photodiodes Pd1, Pd2, Pd3 and Pd4 of FIGS. 10A to 10D, there are two adjoining segmented photodiodes Pd1 and Pd2 of the first segmented photodiode array and two adjoining segmented photodiodes Pd1' and Pd2' of the second segmented photodiode array, which opposes to the fist segmented photodiode array while being shifted by one half the arrangement pitch. Therefore, as shown in FIGS. 4A and 4B, the slit pitch of the scale slit can be made 2-fold of the arrangement pitch (PD pitch) of the segmented photodiodes Pd. That is, the resolution of the scale slit can be made 2-fold of the reference resolution.

As described above, in the present example, plural sets of segmented photodiodes are arranged, each set of which is constructed by a pair of bisected ones of the segmented photodiodes of the photodetector for an optical encoder shown in FIGS. 10A to 10D, which are opposed to each other with their phases shifted by one half the arrangement pitch. Then, the output lines of the corresponding segmented photodiodes are connected together among the sets of photodetectors. Further, the slit length L of the scale slit is made roughly equal to the total width W of the two segmented photodiodes opposed to each other. Therefore, the resolution of the scale slit can be made 2-fold of the reference resolution.

That is, according to the present example, the resolution of the scale slit can be made 2-fold of the reference resolution by changing the arrangement and wiring of the segmented photodiodes without changing the configuration of the segmented photodiodes of FIGS. 10A to 10D, and this arrangement can cope with various resolutions of the code disk or the scale slit easily at low cost.

FOURTH EXAMPLE

The present example is related to a photodetector for an optical encoder capable of coping with various resolutions of a scale slit by changing the connection between the segmented photodiodes of the third example.

In the photodetector for an optical encoder shown in FIGS. 5A to 5D, the output lines of two segmented photodiodes Pd1 and Pd1' are connected together, which photodiodes are opposed to each other with their phases shifted by one half the arrangement pitch in the first segmented photodiode array and the second segmented photodiode array as in the case with the third example.

That is, as one set of segmented photodiodes to function as the segmented photodiodes Pd1, Pd2, Pd3 and Pd4 of FIGS. 10A to 10D, there are four adjoining segmented photodiodes Pd1 to Pd4 of the first segmented photodiode array and four adjoining segmented photodiodes Pd1' to Pd4' of the second segmented photodiode array, which is opposed to the first segmented photodiode array while being shifted by one half the arrangement pitch. Then, these output lines are connected to the corresponding segmented photodiodes among the sets of photodetectors.

In this case, as shown in FIGS. 5A and 5B, the slit pitch of the scale slit can be made 4-fold of the arrangement pitch of segmented photodiodes Pd, and the resolution of the scale slit can be made equal to the reference resolution.

In the case of a photodetector for an optical encoder as shown in FIGS. 6A to 6D, output lines of two adjoining segmented photodiodes Pd1 and Pd2 in the first segmented photodiode array are connected to a output line of one segmented photodiode Pd1' in the second segmented photodiode array, and vice versa, Pd1' of which is opposed to the first segmented photodiode array while being shifted by one half the arrangement pitch of the two segmented photodiodes Pd1 and Pd2.

In the above case, the output lines of two adjoining segmented photodiodes and one opposite segmented photodiode are connected together, the selection of which are alternately changed between the first segmented photodiode array and the second segmented photodiode array.

That is, as one set of segmented photodiodes to function as the segmented photodiodes Pd1, Pd2, Pd3 and Pd4 of FIGS. 10A to 10D, there are arranged the adjoining six segmented photodiodes in the first segmented photodiode array and the adjoining six segmented photodiodes in the second segmented photodiode array, which is opposed to the first segmented photodiode array while being shifted by one half the arrangement pitch, as shown in FIG. 6A. Then, these output lines are connected to the corresponding segmented photodiodes among the sets of photodetectors.

In this case, as shown in FIGS. 6A and 6B, the slit pitch of the scale slit can be made 6-fold of the arrangement pitch of the segmented photodiodes Pd, and the resolution of the scale slit can be made ⅔ of the reference resolution.

In the case of a photodetector for an optical encoder as shown in FIGS. 7A to 7D, output lines of two adjoining segmented photodiodes Pd1 and Pd2 of the first segmented photodiode array are connected to output lines of two segmented photodiodes Pd1' and Pd2' of the second segmented photodiode array, which are opposed to the segmented photodiodes Pd1 and Pd2 while being shifted by one half the arrangement pitch.

That is, as one set of segmented photodiodes to function as the segmented photodiodes Pd1, Pd2, Pd3 and Pd4 of FIGS. 10A to 10D, there are arranged adjoining eight segmented photodiodes of the first segmented photodiode array and adjoining eight segmented photodiodes of the second segmented photodiode array, which is opposed to the first segmented photodiode array while being shifted by one half the arrangement pitch. Then, these output lines are connected to the corresponding segmented photodiodes among the sets of photodetectors.

In this case, as shown in FIGS. 7A and 7B, the slit pitch of the scale slit can be made 8-fold of the arrangement pitch of the segmented photodiodes Pd, and the resolution of the scale slit can be made ½ of the reference resolution.

In the present embodiment, as described above, plural sets of segmented photodiodes are adjacently arranged, each set of which is constructed by two arrays of segmented photodiodes each array of which having n/2 photodetectors for an optical encoder of FIGS. 10A to 10D and which are opposed to each other with their phases shifted by one half the arrangement pitch. The slit length of the scale slit is made roughly equal to or sufficiently longer than the total length of two segmented photodiodes that are opposed to each other.

Therefore, the slit pitch of the scale slit can be made 2n-fold of the arrangement pitch of the segmented photodiodes by connecting together the output lines of n segmented photodiodes opposing each other in each set and connecting together the output lines of the corresponding segmented photodiodes among the sets of photodetectors.

That is, the present embodiment can cope with the scale slit of which the resolution is 2/n of the reference resolution by directly using the photodetector for an optical encoder of FIGS. 10A to 10D and cope with a scale slit of a resolution more various (2-fold) than that of the first embodiment.

Third Embodiment

The present embodiment is related to a photodetector for an optical encoder in which a wide constant gap is provided between photodiodes. The wide constant gap is formed by not providing wiring for the segmented photodiodes located at both ends in the case that the number of adjoining segmented photodiodes, each of which generates an output corresponding to one phase and output lines of which are connected together, is not smaller than three as shown in FIGS. 2A and 3A in the second example of the first embodiment.

In the above case, the change of connection between the segmented photodiodes for obtaining the gap is achieved by changing a plurality of kinds of masks prepared to be used in the forming process of the connection wiring.

FIFTH EXAMPLE

FIG. 8A shows a photodetector for an optical encoder under modification of the second example, where the number of segmented photodiodes is "4", each of which form an output signal corresponding to one phase as stated in the first embodiment, and where the segmented photodiodes Pd1 and Pd4 are not wired which are located at both ends of the segmented photodiodes and only the output lines of the segmented photodiode Pd2 and Pd3 located inside are connected together. Further, these output lines are connected to the corresponding segmented photodiodes among the sets of photodetectors.

With this arrangement, a wide constant gap can be obtained between the segmented photodiodes that constitute each phase. Thereby, the influence of a leakage current can be reduced to improve the signal-to-noise ratio, which current becomes a noise against the signal current from the segmented photodiodes that constitute respective phases.

FIG. 9A shows an photodetector for an optical encoder under modification of the fourth example, where the number of segmented photodiodes is "3", each of which forms an output signal corresponding to one phase in the second embodiment, and where two adjoining segmented photodiodes Pd1 and Pd2 are not wired, which are located on one segmented photodiode array side among three segmented photodiodes that constitute each phase (that is, the photodiodes Pd1 and Pd2 are located outside among three segmented photodiodes), and only one segmented photodiode Pd1' is wired, which is located on the other segmented photodiode array side (that is, the segmented photodiode Pd1' is located inside). Further, these output lines are connected to the corresponding segmented photodiodes among the sets of photodetectors.

Thus, the wide prescribed gap is obtained between the segmented photodiodes that constitute each phase, and the influence of crosstalk between phases is reduced, which allows the signal-to-noise ratio to be improved.

In the present embodiment, the influence of the noise component can be reliably reduced by grounding the output terminals of all the segmented photodiodes that are not wired.

Moreover, in the second embodiment, the number of segmented photodiode arrays is "2", which are arranged in parallel with their phases mutually shifted by one half the arrangement pitch. However, the present invention is not limited to this. It is also possible to arrange three or more segmented photodiode arrays in parallel.

Moreover, if each example of the first embodiment is combined with each example of the second embodiment, the combined arrangement can cope with scale slits of more various resolutions.

Moreover, in each of the above-stated embodiments, the plurality of sets of segmented photodiodes are arranged which function as the segmented photodiodes Pd1, Pd2, Pd3 and Pd4 of FIGS. 10A to 10D in order to level variations in the quantity of light from the light source. However, even one set of the segmented photodiodes makes it possible to produce the effects intended by the present invention.

Moreover, the above-stated embodiments describe as examples the scale slit having the rectangular slits and the photodetector having the rectangular segmented photodiodes that conform to the slits. However, it is needless to say that the present invention may be applied to the case where a code disk having sectorial slits and a photodetector for an optical encoder having segmented photodiodes of a configuration that conforms to the sectorial slits.

Moreover, in each of the above-stated embodiments, the change of connection between the segmented photodiodes is achieved by changing the mask used in the forming process of the connection wiring. However, it is also possible to achieve the change of connection between the segmented photodiodes by adjusting the metal wiring with use of laser trimming.

Furthermore, as illustrated in FIG. 10, it is also possible to change the arrangement pitch (resolution) of the photodiode by changing the number of connected segmented photodiodes with use of switching means SW having a control terminal of a transistor or the like. In this case, the segmented photodiodes, the output lines of which are connected together, are made switchable, and an external control signal in accordance with the resolution of the code disk or the scale slit is used for the switching means SW at the time of the change of the number in the photodiodes.

The invention being thus described, it will be obvious that the invention may be varied in many ways. Such variations are not be regarded as a departure from the spirit and scope of the invention, and all such modifications as would be obvious to one skilled in the art are intended to be included within the scope of the following claims.

What is claimed is:

1. A variable resolution photodetector for an optical encoder comprising:

a first segmented photodiode comprising a first semiconductor chip divided into a plurality of electrically separated first photodiode elements having output terminals, the output terminal of a first one of the plurality of first photodiode elements being connected to a first node and the output terminal of a second one of the plurality of first photodiode elements adjacent to said first one of the plurality of photodiodes being selectively connectable to said first node, whereby the resolution of the photodetector has a first resolution when the second one of the plurality of first photodiode elements is electronically connected to said first node and a second resolution when the second one of the plurality of first photodiode elements is electrically disconnected from said first node.

2. A variable resolution photodetector for an optical encoder comprising:

a segmented photodiode comprising a semiconductor chip divided into a plurality of electrically separated photodiode elements having output terminals, a first pair of mutually adjacent photodiode elements of the plurality of photodiode elements detecting a first phase of a signal and each photodiode element of the first pair of photodiode elements having an output terminal connected to a first common node, and a second pair of mutually adjacent photodiode elements of the plurality of photodiode elements detecting a second phase of the signal and each photodiode element of the second pair of mutually adjacent photodiode elements having an output terminal connected to a second common node, wherein, the first pair of photodiode elements is adjacent to the second pair of photodiode elements, and wherein one photodiode element of said first pair of photodiode elements is selectably disconnectable from said first node and one photodiode element of said second pair of photodiode elements is selectably disconnectable from said second node to change the resolution of the photodetector.

3. A variable resolution photodetector for an optical encoder comprising:

a first segmented photodiode comprising a first semiconductor chip divided into a plurality of electrically separated first photodiode elements having output terminals, the output terminal of a first one of the plurality of first photodiode elements being connected to a first node; and the output terminal of a second one of the plurality of first photodiode elements adjacent to said first one of the plurality of photodiode elements being connected to the first node via a switch having a first state and a second state, wherein shifting the switch from the first state to the second state changes a resolution of the photodetector from a first resolution to a second resolution.

* * * * *